United States Patent
Nagano

(10) Patent No.: US 10,002,996 B2
(45) Date of Patent: Jun. 19, 2018

(54) LIGHT EMITTING DEVICE AND METHOD OF MANUFACTURING THE SAME

(71) Applicant: NICHIA CORPORATION, Anan-shi (JP)

(72) Inventor: Hiroto Nagano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 109 days.

(21) Appl. No.: 14/831,875

(22) Filed: Aug. 21, 2015

(65) Prior Publication Data
US 2016/0053968 A1 Feb. 25, 2016

(30) Foreign Application Priority Data
Aug. 25, 2014 (JP) .................................. 2014-170246

(51) Int. Cl.
*F21V 9/00* (2018.01)
*H01L 33/60* (2010.01)
*H01L 33/62* (2010.01)

(52) U.S. Cl.
CPC .............. *H01L 33/60* (2013.01); *H01L 33/62* (2013.01); *H01L 2924/12041* (2013.01)

(58) Field of Classification Search
CPC ........ F21V 21/005; F21V 21/35; F21V 21/06; F21V 21/08; F21V 21/096; H01L 33/60; H01L 33/62; F21Y 2103/10; F21Y 2103/20; F21Y 2107/50; F21Y 2107/40
USPC ....................................................... 362/293
See application file for complete search history.

(56) References Cited

U.S. PATENT DOCUMENTS

| 8,057,072 B2* | 11/2011 | Takenaka .................. F21K 9/00 257/98 |
| 2006/0022320 A1* | 2/2006 | Nakanishi ........... H01L 23/3114 257/678 |
| 2007/0165411 A1* | 7/2007 | Abdelsamed ............. F21V 5/02 362/341 |
| 2007/0165412 A1* | 7/2007 | Lin ......................... F21V 14/02 362/362 |

(Continued)

FOREIGN PATENT DOCUMENTS

| JP | 2006-41401 | 2/2006 |
| JP | 2006-93359 | 4/2006 |

(Continued)

*Primary Examiner* — Anh Mai
*Assistant Examiner* — Matthew Peerce
(74) *Attorney, Agent, or Firm* — Mori & Ward, LLP

(57) ABSTRACT

A light emitting device includes a light emitting element, a mounting surface, a first terminal, a second terminal, and a light reflecting member. The light emitting element includes a light emission surface to emit a light. The light emission surface of the light emitting element is inclined with respect to the mounting surface. The first terminal and the second terminal are electrically connected to the light emitting element. Each of the first terminal and the second terminal has a substantially spherical shape. The light reflecting member is to hold the light emitting element, the first terminal, and the second terminal. The light emission surface of the light emitting element is exposed from the light reflecting member. A portion of the first terminal and a portion of the second terminal are exposed from the light reflecting member so that each of the portion and the portion has a substantially circular shape.

18 Claims, 9 Drawing Sheets

(56) References Cited

U.S. PATENT DOCUMENTS

| | | | |
|---|---|---|---|
| 2009/0244892 A1* | 10/2009 | Xie | F21K 9/00 362/236 |
| 2009/0323324 A1* | 12/2009 | Liu | F21V 15/01 362/234 |
| 2010/0103659 A1* | 4/2010 | Chen | F21S 6/003 362/231 |
| 2012/0280261 A1 | 11/2012 | Tarsa et al. | |
| 2012/0294004 A1* | 11/2012 | Stathis | F21V 21/26 362/249.1 |
| 2012/0299022 A1* | 11/2012 | Hussell | H01L 25/0753 257/88 |
| 2013/0044501 A1* | 2/2013 | Rudisill | F21V 29/004 362/398 |
| 2013/0234308 A1 | 9/2013 | Yamada et al. | |
| 2013/0299864 A1 | 11/2013 | Sugizaki et al. | |
| 2013/0320381 A1 | 12/2013 | Kojima et al. | |

FOREIGN PATENT DOCUMENTS

| | | |
|---|---|---|
| JP | 2011-258676 | 12/2011 |
| JP | 2012-146898 | 8/2012 |
| JP | 2012-204614 | 10/2012 |
| JP | 2013-201156 | 10/2013 |
| JP | 2013-214540 | 10/2013 |
| JP | 2013-251417 | 12/2013 |
| JP | 2014-513440 | 5/2014 |

\* cited by examiner

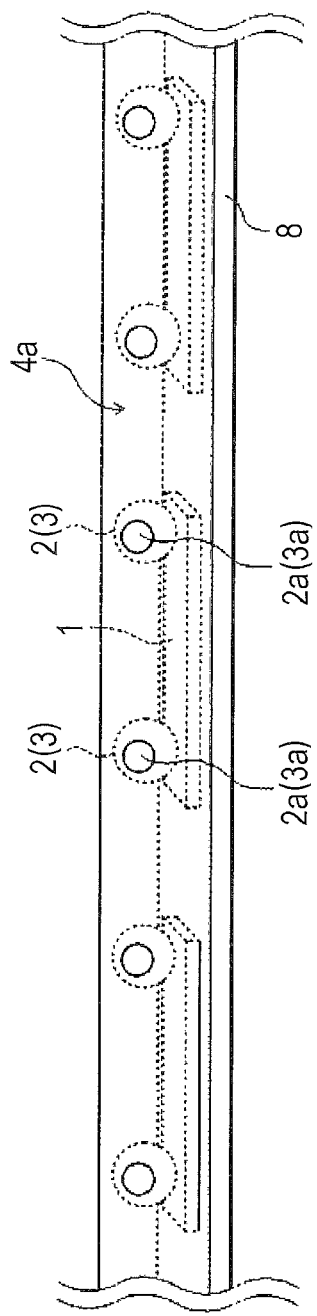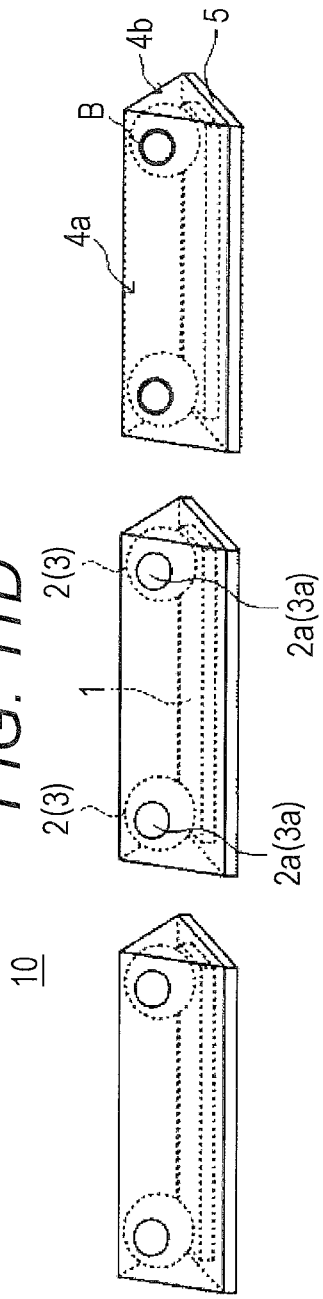

... ...

LIGHT EMITTING DEVICE AND METHOD OF MANUFACTURING THE SAME

CROSS-REFERENCE TO RELATED APPLICATIONS

The present application claims priority under 35 U. S. C. § 119 to Japanese Patent Application No. 2014-170246, filed Aug. 25, 2014. The contents of this application are incorporated herein by reference in their entirety.

BACKGROUND

Technical Field

The present disclosure relates to a light emitting device and a method of manufacturing a light emitting device.

Discussion of the Background

A light emitting diode (LED) has many features of low power consumption, long lifetime, high reliability, and the like, so that as an LED light emitting device which emits white light by combining a blue LED and a phosphor is put to practical use, the LED is widely used for various purposes in various kinds of lights, a light source for backlight, and the like.

Japanese Unexamined Patent Application Publication No. 2012-146898 discloses a chip size package (CSP) type light emitting device. In the CSP type light emitting device, a light emitting element (LED) is directly covered with a light reflecting resin or the like, so that a small and thin light emitting device can be formed. The light emitting device described in Japanese Unexamined Patent Application Publication No. 2012-146898 includes a semiconductor layer, a p-side electrode and an n-side electrode, a p-side wiring layer and an n-side wiring layer, and an insulating layer for insulating each wiring layer, and each of the wiring layers is exposed as an external terminal from each surface of the insulating layers. In addition, according to a disclosed configuration, a light emission surface (first surface) is inclined with respect to a mounting surface (third surface) in the light emitting device, so that in a case where the mounting surface is a horizontal surface, light is emitted obliquely upward.

SUMMARY OF THE INVENTION

According to one aspect of the present invention, a light emitting device includes a light emitting element, a mounting surface, a first terminal, a second terminal, and a light reflecting member. The light emitting element includes a light emission surface to emit a light. The light emitting device is to be placed via the mounting surface. The light emission surface of the light emitting element is inclined with respect to the mounting surface. The first terminal and the second terminal are electrically connected to the light emitting element. Each of the first terminal and the second terminal has a substantially spherical shape. The light reflecting member is to hold the light emitting element, the first terminal, and the second terminal. The light emission surface of the light emitting element is exposed from the light reflecting member. A portion of the first terminal and a portion of the second terminal are exposed from the light reflecting member so that each of the portion and the portion has a substantially circular shape.

According to another aspect of the present invention, a method of manufacturing a light emitting device includes connecting a first terminal and a second terminal to a light emitting element. Each of the first terminal and the second terminal has a substantially spherical shape. A light reflecting member is formed to cover the light emitting element, the first terminal, and the second terminal such that a light emission surface of the light emitting element is exposed from the light reflecting member and such that a mounting surface of the light emitting device is inclined with respect to the light emission surface. The light emitting element is to emit a light from the light emission surface. The light emitting device is to be placed via the mounting surface. The first terminal and the second terminal are partially exposed from the light reflecting member.

According to further aspect of the present invention, a method of manufacturing a light emitting device includes connecting a first terminal and a second terminal to a connection surface of a light emitting element. Each of the first terminal and the second terminal has a substantially spherical shape. A light reflecting member is formed to cover at least one part of the light emitting element, and the first terminal and the second terminal with the light reflecting member. A portion of the first terminal and a portion of the second terminal are exposed from the light reflecting member so that a plane including the portion and the portion provides an angle other than 90° with respect to a light emission surface of the light emitting element opposite to the connection surface of the light emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 11C is a schematic view showing a terminal exposing step in the method of manufacturing the light emitting device 10 according to the first embodiment;

FIG. 11D is a schematic view showing a singulating step in the method of manufacturing the light emitting device 10 according to the first embodiment;

DESCRIPTION OF THE EMBODIMENTS

Hereinafter, embodiments will be described with reference to the drawings. However, a light emitting device which will be described below is only provided to embody a technical idea of the present disclosure, and the present invention is not limited thereto. Specifically, a dimension, material, shape, relative arrangement of the components which will be described below do not limit a technical range of the present invention unless otherwise described, and they are only examples for the description. In addition, a size and positional relation of a member shown in each drawing are sometimes exaggerated to make clear the description. Furthermore, as for each component in the embodiments, the plurality of components may be composed of one member and the one member serves as the plurality of components, or conversely, a function of the one member may be shared with the plurality of members. In addition, each configuration can be appropriately combined to be applied in the embodiments described below also unless otherwise specified.

First Embodiment

Figure 1:
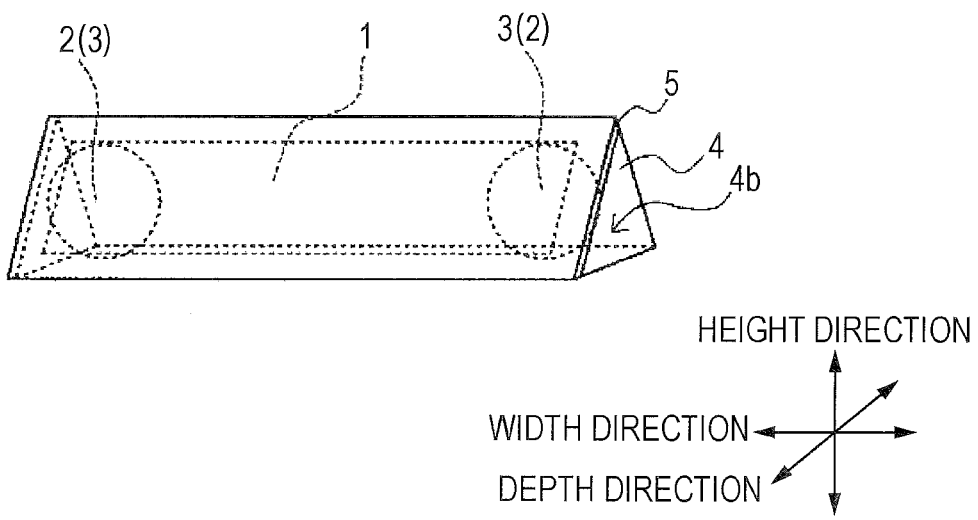
FIG. 1 is a schematic perspective view of a light emitting device 10 according to a first embodiment.
Figure 2:
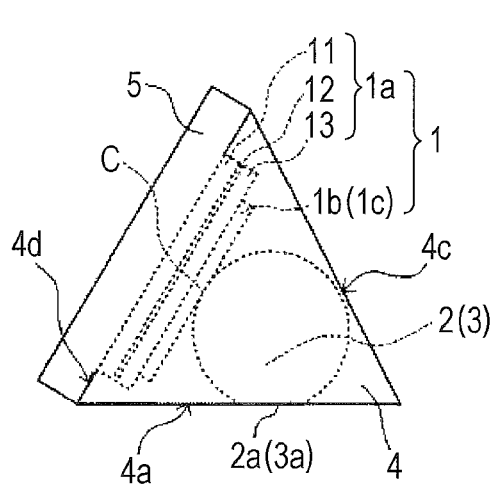
FIG. 2 is a schematic view of the light emitting device 10 according to the first embodiment, seen from a side surface side.

As shown in FIG. 1, a light emitting device 10 according to the first embodiment is suited for being used mainly as a side emission type light emitting device. The light emitting device 10 includes a light emitting element 1, a first terminal 2 and a second terminal 3 respectively electrically connected to the light emitting element 1, and a light reflecting member 4 for holding the light emitting element 1, the first terminal 2, and a second terminal 3. As shown in FIG. 2, the light emitting element 1 may include a semiconductor layer 1a, an n-side electrode 1b, and a p-side electrode 1c. A light emission surface of the light emitting element 1 (opposite side from the electrode formation surface of the semiconductor layer 1a) is exposed from the light reflecting member 4, and arranged so as to be inclined toward a back surface of the light emitting device 10 (a back surface 4c of the light reflecting member 4) with respect to a mounting surface of the light emitting device 10 (a bottom surface 4a of the light reflecting member 4).

Each of the first terminal 2 and the second terminal 3 has a substantially spherical shape, and the first terminal 2 or the second terminal 3 is electrically connected to one of the n-side electrode 1b and the p-side electrode 1c of the light emitting element 1. The connection portion of each electrode of the light emitting element 1 and the first terminal 2 or the second terminal 3 is referred to as a connection portion C.

Each of the first terminal 2 and the second terminal 3 is partially exposed from the light reflecting member 4. As external terminal portions 2a and 3a, the exposed portion of the first terminal 2 and the exposed portion of the second terminal 3 are respectively electrically connected to a wiring of a mounting substrate.

As shown in FIGS. 1 and 2, the light reflecting member 4 forms external surfaces of the light emitting device 10. The light reflecting member 4 has a substantially triangular shape in a cross-sectional view. The light reflecting member 4 may have a substantially triangular prismatic shape which includes the bottom surface 4a, side surfaces 4b, the back surface 4c, and a front surface 4d. The bottom surface 4a of the light reflecting member 4 serves as the mounting surface of the light emitting device 10, and arranged to be inclined with respect to the light emission surface of the light emitting element 1. The side surfaces 4b of the light reflecting member 4 are respectively oriented approximately perpendicularly to the bottom surface 4a. The side surfaces 4b are substantially in parallel to each other. The front surface 4d of the light reflecting member 4 is inclined with respect to the bottom surface 4a (mounting surface) in a similar manner as the light emission surface of the light emitting element 1, and covers the electrode formation surface side of the light emitting element 1. The light reflecting member 4 preferably has a substantially triangular prismatic shape, but a substantially triangular pyramidal shape, a substantially columnar shape, or an substantially conical shape may also be employed. In the description below, it is assumed that a direction perpendicular to the back surface 4c may be referred to as a "depth direction", a direction perpendicular to the bottom surface 4a may be referred to as a "height direction", and a direction perpendicular to the side surfaces 4b may be referred to as a "width direction".

Figure 3:
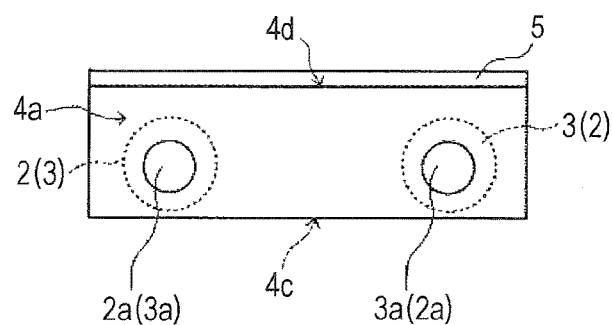
FIG. 3 is a schematic view of the light emitting device 10 according to the first embodiment, seen from a bottom surface side.

According to the present embodiment, the external terminal portions 2a and 3a, which are respectively partially exposed portions of the first terminal 2 and second terminal 3, provided on the bottom surface 4a of the light reflecting member 4 (mounting surface). As shown in FIG. 3, each of the external terminal portions 2a and 3a has a substantially circular shape, and is formed near the back surface 4c (on the rear side), in the bottom surface 4a (mounting surface) of the light reflecting member 4.

According to the above configuration, each of the first terminal 2 and the second terminal 3 has the substantially spherical shape which can facilitate manufacturing of the compact light emitting device 10 that has the light emission surface inclined with respect to the mounting surface. Furthermore, costs and time can be reduced, compared with a case where a terminal is formed by using a plating method to have a desired thickness. Furthermore, the external terminal portions 2a and 3a can be formed near the back surface of the light emitting device 10 (the back surface 4c of the light reflecting member 4), in the mounting surface (the bottom surface 4a of the light reflecting member 4). That is, a sufficiently large distance can be ensured between the light emission surface (light emitting element 1) and the external terminal portions 2a and 3a. Therefore, it is possible to manufacture the light emitting device 10 which can be stably positioned at the time of mounting on the mounting substrate 20, and thus stable mounting can be obtained.

Each component of the light emitting device 10 according to the first embodiment will be described in detail below. In addition, a configuration of each component which will be described below is just one example, and the present invention is not limited to that configuration.

Light Emitting Device 10
Light Emitting Element 1

As shown in FIG. 2, the light emitting element 1 includes the semiconductor layer 1a having an n-type semiconductor layer 11, an active layer 12, and a p-type semiconductor layer 13; the n-side electrode 1b formed on the n-type semiconductor layer 11; and the p-side electrode 1c formed on the p-type semiconductor layer 13. According to the present embodiment, the n-type semiconductor layer 11, the active layer 12, and the p-type semiconductor layer 13 of the semiconductor layer 1a are stacked in the order in the depth direction. For example, the semiconductor layer 1a may be made of a nitride semiconductor ($In_XAl_YGa_{1-X-Y}N$ ($0 \leq X$, $0 \leq Y$, $X+Y \leq 1$)), GaAlAs, AlInGaP, or the like. Each semiconductor layer may have a single-layer structure, or a stacked-layer structure or a super lattice structure, made of layers each having a different composition and different thickness. The active layer 12 is preferably has a single quantum well structure or a multiquantum-well structure. The light emitting element 1 may have a substrate in addition to the semiconductor layer 1a. For the substrate, a component having high light transmissive properties such as sapphire can be used, in order to efficiently extract the light from the light emitting element 1. In the case of the light emitting device having the semiconductor layer 1a formed on the substrate, the light extraction efficiency of light from the light emitting device 1 can be improved by removing the substrate. The substrate can be easily removed by a laser lift-off (LLO) method, for example. An amount of irradiation and/or a duration of the laser irradiation can be appropriately adjusted according to the type and thickness of the substrate.

In the case where the substrate is removed by using a laser lift-off method, the light extraction from the semiconductor layer 1a can be improved by roughening the surface of the semiconductor layer 1a by etching or the like. In addition, a protective layer may be formed on the surface of the semiconductor layer 1a after the substrate is removed.

The n-side electrode 1b can be formed on a portion of the n-type semiconductor layer 11 which is exposed by partially removing the active layer 12 and the p-type semiconductor layer 13 of the semiconductor layer 1a by, for example, using, a RIE method with the use of a resist. The p-side electrode 1c is formed on the p-type semiconductor layer 13. In the present embodiment, the n-side electrode 1b and the p-side electrode 1c are arranged in a row in the width direction. Examples of the materials of each electrode include Au, Ag, an Ag alloy, Al, an Al alloy, and ITO. Each electrode can be formed by using asputtering method, a vapor deposition method, and the like. The upper surfaces of the n-side electrode 1b and the p-side electrode 1c preferably have substantially a same height, so that the first terminal 2 and the second terminal 3 can be easily connected thereto. A bump or the like may be provided on each electrode.

First Terminal 2 and Second Terminal 3

Each of the first terminal 2 and the second terminal 3 has the substantially spherical shape, and is connected to the n-side electrode 1b or the p-side electrode 1c of the light emitting element 1, respectively. More specifically, each of the first terminal 2 and the second terminal 3 has a chipped spherical shape in which a portion of the spherical shape is removed and in the present specification, such a shape is referred to as "the substantially spherical shape". Each of the first terminal 2 and the second terminal 3 preferably has the substantially spherical shape which has a circular cross-section, but the substantially spherical shape which has a cross-sectional shape of an elliptical shape or the like may also be employed. The removed portions of the first terminal 2 and the second terminal 3 (the surfaces partially removed from the spherical shapes) form planes that are respectively exposed from the light reflecting member 4, and serve as the external terminal portions 2a and 3a, respectively to be connected to a mounting substrate 20. In the present embodiment, as shown in FIG. 1, the first terminal 2 and the second terminal 3 having substantially same dimensions are connected to the respective electrodes of the light emitting element 1, and are arranged in a row in the width direction.

Figure 4:
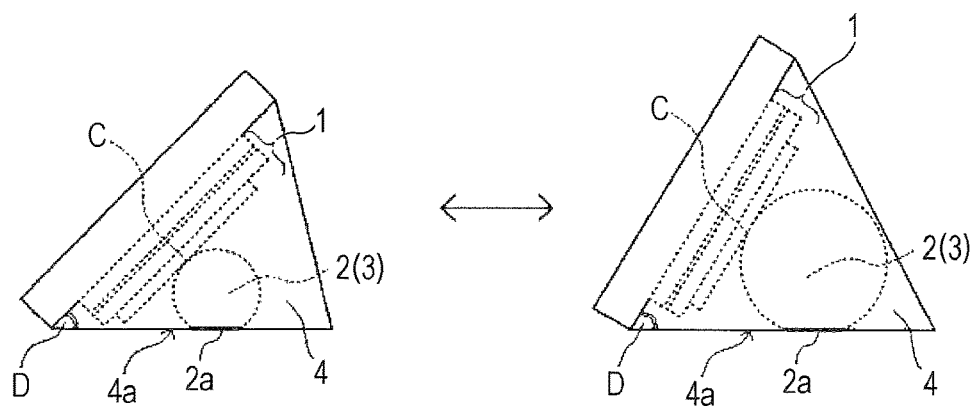
FIG. 4 is a schematic view showing a relationship between a size of a terminal and an inclined angle of a light emission surface with respect to a mounting surface, in the light emitting device according to an embodiment.

The first terminal 2 and the second terminal 3 having the substantially spherical shapes allows forming of a light emitting device in which, the light emission surface (of the light emitting element 1) can be inclined at a desired inclination angle D with respect to the mounting surface (i.e., the bottom surface 4a of the light-reflecting member 4), by adjusting the dimensions of the terminals 2 and 3 and the position of the connection portion C between the terminals 2 and 3 and the light emitting element 1. More specifically, as shown in FIG. 4, increasing the dimensions of each of the terminals 2 and 3 without changing the positions of the external terminal portions 2a and 3a allows for formation of the light emission surface (of the light emitting element 1) with a large inclination angle D with respect to the mounting surface (i.e., the bottom surface 4a). Reducing the dimensions of each of the terminals 2 and 3 without changing the positions of the external terminal portions 2a and 3a allows for formation of the light emission surface (of the light emitting element 1) with a small inclination angle D with respect to the mounting surface (i.e., the bottom surface 4a).

Figure 5:
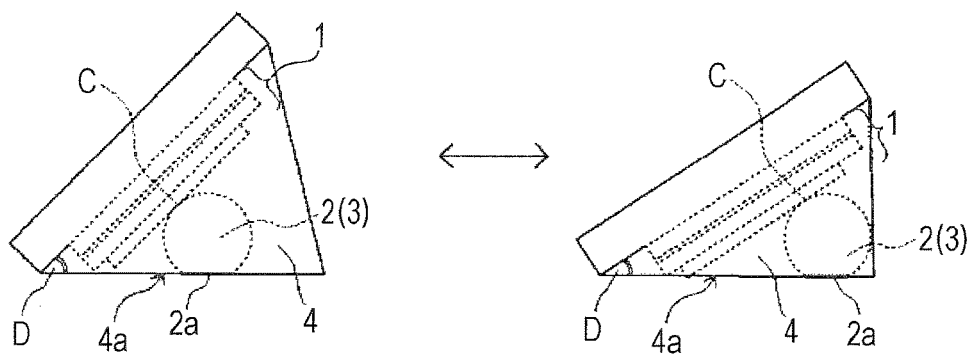
FIG. 5 is a schematic view showing a relationship between a position of a connection portion C, and an inclined angle D of a light emission surface with respect to a mounting surface, in a light emitting device according to an embodiment.

As shown in FIG. 5, without changing the dimensions of each of the terminals 2 and 3, shifting the position of the connection portion C to a higher position of the light emitting element 1 with respect to the mounting surface (i.e., the bottom surface 4a) allows for formation of the light emission surface (light emitting element 1) with a small inclination angle D with respect to the mounting surface (bottom surface 4a). On the other hand, without changing the dimensions of each of the terminals 2 and 3, shifting the position of the connection portion C to a lower position of the light emitting element 1 with respect to the mounting surface (i.e., the bottom surface 4a) allows for formation of the light emission surface (light emitting element 1) with a large inclination angle D with respect to the mounting surface (bottom surface 4a).

Further, shifting the position of the connection portion C between the terminals 2 and 3 and the light emitting element 1 to a higher position of the light emitting element 1 with respect to the mounting surface (i.e., the bottom surface 4a) allows for formation of the external terminal portions 2a and 3a closer to the back surface 4c with respect to the mounting surface (i.e., bottom surface 4a). This arrangement allows for formation of the light emitting device 10 that can be stably mounted on the mounting substrate.

Further, increasing the dimensions of each of the terminals 2 and 3, or shifting the position of the connection portion C between the terminals 2 and 3 and the light emitting element 1 to an end of the light emitting element 1 (that is, arranging the terminals 2 and 3 close to an outer surface of the light reflecting member 4) allows for formation of the external terminal portions 2a and 3a on a plurality of surfaces. For example, the external terminal portions 2a and 3a can be formed not only in the bottom surface 4a (i.e., the mounting surface) of the light reflecting member 4, but also in one of one or both the side surfaces 4b and/or in the back surface 4c. Formation of a plurality of the external terminal portions 2a and 3a as described above allows for enhancing of the connection strength between the light emitting device 10 and the mounting substrate. In addition, along with a change in the dimensions of the terminals 2 and 3 or in the position of the connection portion C, an electrode pattern of the light emitting element 1 and a wiring pattern of the mounting substrate can be appropriately changed.

Figure 6:
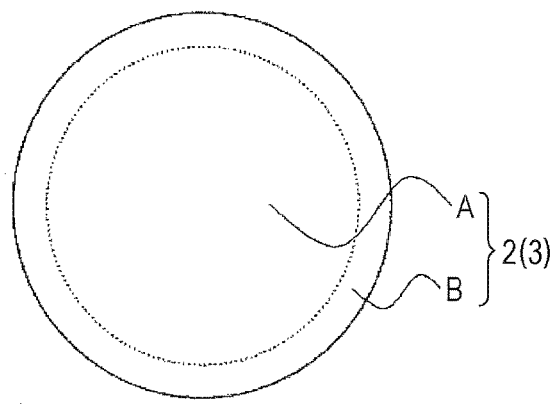
FIG. 6 is a schematic view showing a configuration of each of a first terminal and a second terminal.

The first terminal 2 and the second terminal 3 are preferably made of an electrically-conductive material which can be easily bonded to the electrodes 1b and 1c of the light emitting element 1 and to a wiring 21 of the mounting substrate 20 by heating, and can keep their predetermined shapes even after being heated (bonded). For example, as shown in FIG. 6, each of the terminals 2 and 3 may have a configuration that includes an electrically-conductive core A and an electrically-conductive covering portion B which covers the core A. Hereinafter, a description will be given to the substantially spherical first terminal 2 and second terminal 3 each includes the electrically-conductive core A and the covering portion B.

The core A is preferably made of a material containing Cu as its major component (for example, Cu content is 50% by mass or greater). Particularly, the core A is preferably made of a material whose Cu content is 99% by mass or more, or an alloy of Cu with one or more metals selected from Zn, Sn, P, Ni, Au, Mo, and W, because excellent thermal and electrical conductivity can be provided. The core A preferably has a substantially spherical shape, because the terminal can be easily formed into the substantially spherical shape. The core A preferably has a diameter of about 1 μm to about 1000 μm, and more preferably has a diameter of about 40 μm to about 200 μm.

The covering portion B is preferably made of an alloy of Au with at least one of Si, Ge, and Sn. Particularly, in the case of the terminal where the core A is covered with a Sn-based covering portion B, when the covering portion B is exposed in the external terminal portions 2a and 3a, the covering portion B may be used as a bonding agent to connect the light emitting device to the mounting substrate. In addition, the covering portion B may also be made of Ni, Ni—B, Ni—P, or the like. Here, the Sn-based covering portion B may have a single-layer structure made of a Sn-based alloy, or may have a multi-layer structure made of Sn and another alloy, or a plurality of Sn alloys. The covering portion B may have a thickness of about 1 μm to about 50 μm, more preferably about 1 μm to about 10 μm in the case where the covering portion B is composed of Sn. With such a thickness, the electrodes of the light emitting element 1 and the wiring 21 of the mounting substrate 20 can be connected preferably and also, occurrence of short circuit between the first terminal 2 and the second terminal 3 can be prevented.

As described above, in the case of using the terminal that includes the core A and the covering portion B, the core A is preferably made of a material which has a melting temperature higher than that of the covering portion B. For example, with the use of the first terminal and the second terminal each includes the core A made of Cu which is covered with the covering portion B made of Sn as described above, eutectic bonding can be easily provided respectively between the electrodes of the light emitting element 1 and the first terminal 2 and the second terminal 3, by placing the terminals on the electrodes of the light emitting element 1 and heating.

In the above, the substantially spherical first terminal 2 and the second terminal 3 each including the core A and the covering portion B are described, but the present invention is not limited thereto. The first terminal 2 and/or the second terminal 3 may not include the core A and the covering portion B, and the light emitting element 1 may be bonded to the first terminal 2 and the second terminal 3 by a method other than the eutectic bonding. In addition, a plurality of first terminals 2 and/or a plurality of second terminals 3 may be arranged respectively, with respect to corresponding electrodes of the light emitting device 1, and the plurality of terminals may have different configurations and dimensions. In a second embodiment below, a light emitting device having a plurality of terminals with different dimensions will be described.

External Terminal Portions 2a and 3a

As shown in FIG. 3, each of the external terminal portions 2a and 3a has a substantially circular shape in a plan view. The external terminal portions 2a and 3a preferably have a circular shape, but an elliptical shape or the like may also be employed. Furthermore, diameters of the external terminal portions 2a and 3a are preferably smaller than the diameters of the first terminal 2 and the second terminal 3, respectively. The substantially circular external terminal portions 2a and 3a are the exposed portions of the substantially spherical first terminal 2 and the second terminal 3, respectively. Cutting the first terminal 2, the second terminal 3, and the light reflecting member 4 at the same time, the substantially circular external terminal portions 2a and 3a can be made substantially flush with the light reflecting member 4. In addition, each of the first terminal 2 and the second terminal 3 is preferably cut by a thickness equal to or larger than the thickness of the covering portion B. Thus, the core A can be exposed on the surface of each of the external terminal portions 2a and 3a, so that the light emitting device 10 can be mounted with high reliability. Furthermore, the external terminal portions 2a and 3a are not necessarily made substantially flush with the light reflecting member 4. For example, one or both the external terminal portions may be formed recessed with respect to the bottom surface 4a (i.e., the mounting surface) of the light reflecting member 4. With this arangement, a bonding agent to bond the light emitting device 10 and the mounting substrate can be arranged in the recess of the external terminal portion, so that bonding strength between the light emitting device 10 and the mounting substrate can be improved.

As described above, with the use of the first terminal 2 and the second terminal 3 each have the covering portions B, the covering portion B can be formed at least one portion of the surface of each of the external terminal portions 2a and 3a. With this arrangement, the covering portion B can be used as the bonding agent for bonding the light emitting device 10 and the mounting substrate.

Each of the external terminal portions 2a and 3a can be disposed in any appropriate surface of the light reflecting member 4. According to the present embodiment, the external terminal portions 2a and 3a are formed in the bottom surface 4a of the light reflecting member 4 which is to be mounted substantially in parallel with the upper surface of the mounting substrate. With this arrangement, the light emitting device 10 and the mounting substrate can be stably bonded, and sufficient bonding strength can be reliably obtained. Furthermore, forming the external terminal portions 2a and 3a on a plurality of surfaces of the light reflecting member 4 allows for improvement of the bonding strength between the light emitting device and the mounting substrate. In addition, the external terminal portions 2a and 3a are not needed to be formed in the bottom surface 4a (i.e., the mounting surface) of the light reflecting member 4.

Furthermore, a protective film may be formed on the surfaces of the external terminal portions 2a and 3a (the cut surfaces of the first terminal 2 and the second terminal 3). The protective film can be formed by using electrolytic plating or electroless plating, or made of an antioxidant, a preflux, a discoloration inhibitor, or the like. With such a protective film degaradation and/or damage of the external terminal portions 2a and 3a can be suppressed. The protective film may be &allied not only on the surfaces of the external terminal portions 2a and 3a but also on the surface of the light reflecting member 4 in which the external terminal portions 2a and 3a are formed. Thus, in the case where the protective film is made of a material having thermal conductivity such as a metal, heat releasing property of the light emitting device 10 can be enhanced.

Light Reflecting Member 4

As shown in FIGS. 1 and 2, the light reflecting member 4 holds the light emitting element 1, the first terminal 2, and the second terminal 3. More specifically, the light reflecting member 4 covers the electrode formation surface of the light emitting element 1, and the first terminal 2 and the second terminal 3 except for the external terminal portions. The light reflecting member 4 electrically isolates the first terminal 2 and the second terminal 3, and reflects the light emitted from the semiconductor layer 1a toward the light emission surface of the light emitting device 10. As described above, the light reflecting member 4 according to the first embodiment has a substantially triangular prismatic shape (i.e., a pentahedron) that includes the bottom surface 4a serving as the mounting surface of the light emitting device 10, the side surfaces 4b, the back surface 4c, and the front surface 4d that covers the electrode formation surface side of the light emitting element 1. According to the present embodiment, the substantially spherical first terminal 2 and second terminal 3 are enclosed in the light-reflecting member 4 so that the outer surfaces thereof are each approximately internally in contact with the light reflecting member 4, with partially exposing the first terminal 2 and the second terminal 3 as the external terminal portions 2a and 3a, respectively.

The light reflecting member 4 that has a substantially triangular prismatic shape can facilitate the formation of the light emitting device 10 in which the light emission surface is inclined with respect to the mounting surface. Particularly, with the light reflecting member 4 in a substantially right-angled triangular prismatic shape, the light emitting device 10 can be more stably mounted on the mounting substrate. Furthermore, the substantially spherical first terminal 2 and second terminal 3 can be easily arranged approximately internally in contact with the light reflecting member 4, so that the light emitting device 10 to obliquely emit light can be obtained with a small size and high heat releasing property.

As shown in FIG. 2, in a cross-sectional view, the semiconductor layer 1a that is the light emission surface is preferably arranged above the bottom surface 4a of the light reflecting member 4 that is the mounting surface. Especially, with positioning the semiconductor layer 1a (i.e. light emission surface) entirely above the bottom surface 4a (i.e., the mounting surface) of the light reflecting member 4, the light emitting device 10 that hardly turns over toward the back surface 4c at the time of mounting on the mounting substrate, so that the light emitting device 10 can be more stably mounted on the mounting substrate.

Figure 7:
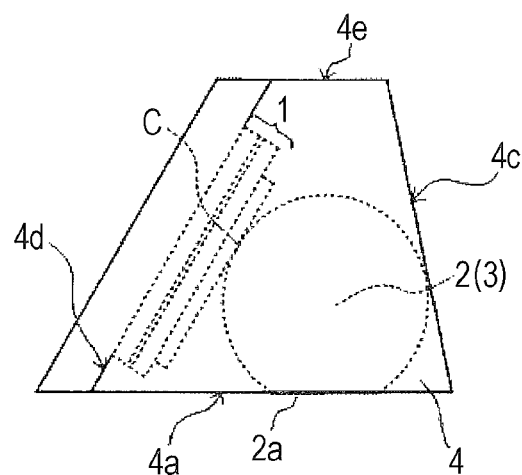
FIG. 7 is a schematic view showing one example of a light emitting device according to an embodiment.

The back surface 4c of the light reflecting member 4 which is opposed to the light emission surface (i.e., semiconductor layer 1a) is preferably inclined toward the light emission surface (i.e., semiconductor layer 1a). For example, in the case where the light emission surface (i.e., semiconductor layer 1a) is inclined toward the back surface 4c with respect to the mounting surface (i.e., the bottom surface 4a of the light reflecting member 4), an angle formed between the back surface 4c of the light reflecting member 4 and the mounting surface (i.e., the bottom surface 4a of the light reflecting member 4) is preferably a right angle or an acute angle. With this configuration, the light emitting device 10 hardly turns over. As shown in FIG. 7, the light reflecting member 4 may have an upper surface 4e in addition to the bottom surface 4a, the side surface 4b, the back surface 4c, and the front surface 4d. Each surface of the light reflecting member 4 is preferably a substantially flat surface, but it is not necessarily to be a flat surface. For example, the surface where the external terminal portions 2a and 3a are exposed may have a recess at the boundaries with the external terminal portions 2a and 3a.

The material of the light reflecting member 4 is not particularly limited as long as the material can electrically isolate the first terminal 2 and the second terminal 3, and can reflect the light emitted from the semiconductor layer 1a to the light emission surface side of the light emitting device 10. For example, the material may be a light reflecting material contained in a base material. Examples of the base material include ceramic, resin, glass, dielectric material, pulp, and a composite material containing two or more kinds of these. Particularly, it is preferably a resin which can be easily molded into a desired shape. Examples of the resin include a silicone resin, a modified silicone resin, an epoxy resin, a modified epoxy resin, a phenol resin, an acrylic resin, a polycarbonate resin, a polynorbornene resin, and a hybrid resin containing two or more kinds of these resins. Examples of the light reflecting material include titanium oxide, zinc oxide, titanium dioxide, silicon dioxide, zirconium dioxide, potassium titanate, alumina, aluminum nitride, boron nitride, mullite, niobium oxide, barium sulfate, carbon black, and various kinds of rare-earth oxides (such as yttrium oxide, or gadolinium oxide). The base material may also contain a filler such as a diffusing agent or a coloring agent.

A reflectivity of the light reflecting member 4 for the light emitted from the light emitting element 1 is preferably about 60% or more, and more preferably about 70% to about 90%.

Wavelength Conversion Layer 5

As shown in FIG. 2, the light emission surface side of the light emitting element 1 (that is, the semiconductor layer 1a which is exposed from the light reflecting member 4) is preferably covered with the wavelength conversion layer 5. The wavelength conversion layer 5 is, for example, made of a base material which can transmit the light emitted from the light emitting element 1 and contains a wavelength conversion member which can convert a wavelength of the light emitted from the light emitting element 1 into a desirable wavelength. Examples of the base material include a silicone resin, a modified silicone resin, an epoxy resin, a modified epoxy resin, a phenol resin, an acrylic resin, a polycarbonate resin, a polynorbornene resin, and a hybrid resin containing two or more kinds of these resins, and glass. For the wavelength conversion member, a desired phosphor can be used. In addition, for the wavelength conversion member, a light emitting material such as so-called "nanocrystal phosphor" or "quantum dot phosphor" may be used. Furthermore, the wavelength conversion layer 5 may contain a diffusing agent.

Examples of the phosphor include nitride-based phosphor and oxynitride-based phosphor which are activated mainly with a lanthanoid-based element such as europium or cerium, more specifically, α-sialon or β-sialon type phosphor and various kinds of alkali earth metal nitride silicate phosphors which are activated with europium, alkali earth metal halogen apatite phosphor, alkali earth halosilicate phosphor, alkali earth metal silicate phosphor, alkali earth metal halogen borate phosphor, alkali earth metal aluminate phosphor, alkali earth metal silicate, alkali earth metal sulfide, alkali earth metal thiogallate, alkali earth metal silicon nitride, and germanate which are activated mainly with a lanthanoid-based element such as europium or a transition metal-based element such as manganese, rare earth aluminate and rare earth silicate which are activated mainly with a lanthanoid-based element such as cerium, and organic substance and organic complexes which are activated mainly with a lanthanoid-based element such as europium. Particularly, a YAG-based phosphor which is a yellow-light emitting phosphor, a KSF which is a red-light emitting phosphor, and a LAG-based phosphor which is a green-light emitting phosphor are preferably used. Besides the above, a phosphor which exhibits similar performance and effect can be appropriately used. The phosphor may be used singly or in combination of two or more kinds.

As the quantum dot phosphor, more specifically, nano-size high dispersible particles such as CdSe, core/shell structure $CdS_XSe_{1-X}$/ZnS, or GaP may be used.

Mounting Substrate 20

Figure 8:
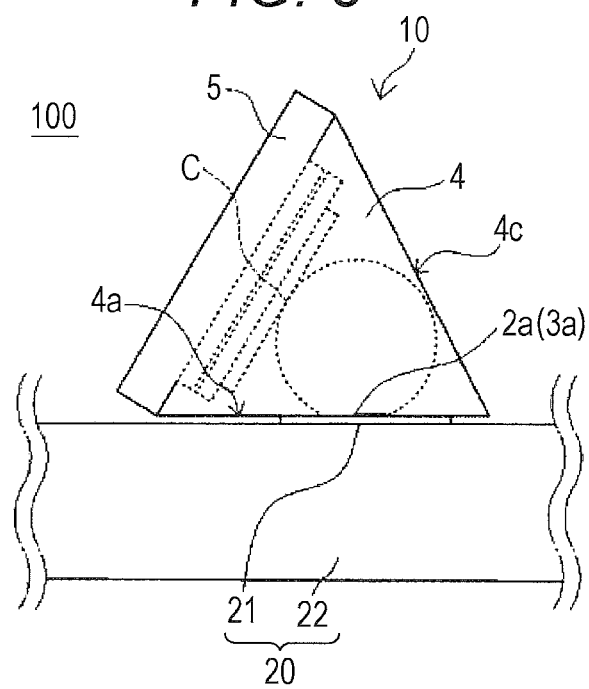
FIG. 8 is a schematic view showing a light emitting module according to an embodiment.

As shown in FIG. 8, the light emitting device 10 is mounted on the mounting substrate 20, and the mounting substrate 20 has the wirings 21 and a base member 22. The wirings 21 are respectively electrically connected to the external terminal portions 2a and 3a of the light emitting device 10. The mounting substrate 20 may be structured simply with the wirings 21.

Wiring 21

Examples of the material of the wirings 21 include a metal material such as copper, nickel, palladium, tungsten, chrome, titanium, aluminum, silver, gold, or an alloy of them. The wirings 21 are particularly preferably made of copper or a copper alloy, in view of a heat releasing property, to release the heat generated in the light emitting device 10. In addition, a film composed of silver, platinum, tin, gold, copper, rhodium, or an alloy of those may be formed on a surface of the wirings made of an appropriate material. Furthermore, a film of silver oxide or a silver alloy oxide may be formed to cover the surfaces of the wirings by oxidizing the surfaces of the wirings made of silver or a silver alloy.

Base Member 22

Examples of the material of the base member 22 include an insulating material such as ceramics, a glass epoxy, or a resin. It is particularly preferably made of ceramics that have high heat resistance and high weather resistance. The ceramics material is preferably alumina, aluminum nitride, or mullite, and a low temperature co-fired ceramics (LTCC) may also be employed. Besides the above, an insulating in which a surface of a metal material is covered with an insulating material can also be employed.

Light Emitting Module 100

The light emitting module 100 shown in FIG. 8 includes the light emitting device 10 and the mounting substrate 20 electrically connected to the light emitting device 10. According to the present embodiment, the mounting surface (i.e., the bottom surface 4a of the light reflecting member 4) of the light emitting device 10 is mounted on the wirings 21 of the mounting substrate 20, and the external terminal portions 2a and 3a formed in the bottom surface 4a of the light reflecting member 4 are respectively bonded to the wirings 21 via a bonding agent (e.g., made of an electrically-conductive bonding agent such as a solder, or an anisotropically-conductive member such as ACP).

According to the first embodiment, the mounting surface (i.e., the bottom surface 4a of the light reflecting member 4) of the light emitting device 10 is mounded on the mounting substrate 20 substantially in parallel to the mounting surface of the mounting substrate 20. Accordingly, the light emission surface of the light emitting device 10 is obliquely arranged with respect to the mounting substrate 20, and the light of the light emitting device 10 is emitted obliquely upward with respect to the mounting substrate 20.

Method of Manufacturing Light Emitting Device 10

Hereinafter, a method of manufacturing the light emitting device 10 and the light emitting module 100 according to the present embodiment will be described with reference to FIGS. 9 to 13. The following description is just one example, so that a desired method and a desired step order may be appropriately used.

Connecting Terminal

Figure 9:
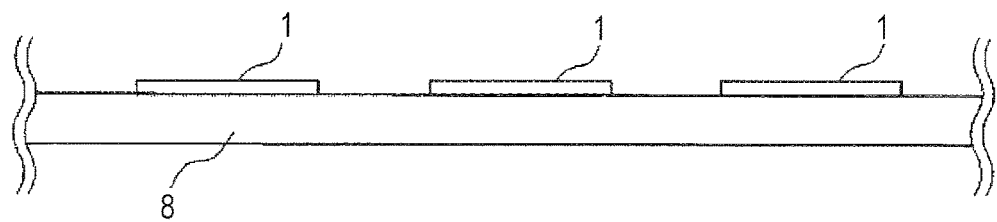
FIG. 9 is a schematic view showing a step of arranging a plurality of light emitting elements on a sheet, in a method of manufacturing the light emitting device 10 according to the first embodiment.

In a step of connecting terminal, the substantially spherical first terminal 2 and second terminal 3 are connected to the light emitting element 1. First, as shown in FIG. 9, a plurality of light emitting elements 1 each including the semiconductor layer, the n-side electrode, and the p-side electrode are provided and arranged on a sheet 8. For example, the sheet 8 includes a bonding layer made of an acrylic-based resin arranged on a base material made of a polyimide, and the light emitting elements 1 are disposed on the sheet 8 at an interval of about 0.4 mm to about 2.3 mm from each other. Flux may be applied on the n-side electrode and the p-side electrode of the light emitting element 1. The flux can be applied by using an appropriate method such as a printing method or a transfer printing method.

Figure 10:
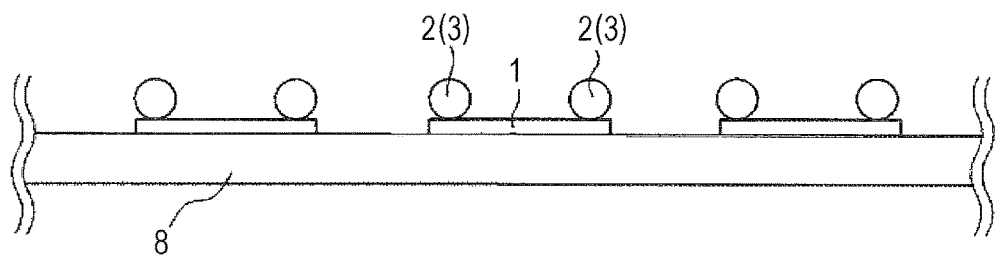
FIG. 10 is a schematic view showing a terminal connecting step in the method of manufacturing the light emitting device 10 according to the first embodiment.

Subsequently, as shown in FIG. 10, the first terminal 2 and the second terminal 3 are set on the n-side electrode and the p-side electrode of the light emitting element 1, respectively. In the present embodiment, each of the first terminals 2 and the second terminals 3 is previously formed in a diameter of about 110 µm, in which a Cu core ball A with a diameter of about 100 µm is covered with a covering portion B of Sn with a thickness of about 5 µm, and then, with the use of with a suction jig, each of the first terminals 2 and the second terminals 3 is placed on the corresponding electrode of each of the light emitting elements 1 via a temporary fixing material. For the temporary fixing material, a known material can be used as appropriate. Further, previously disposing a holding member which defines a recess corresponding to the shape of the corresponding terminal on each of the electrodes of the light emitting elements 1, or alternatively, forming each of the electrodes in a shape that defines a recess corresponding to the shape of the corresponding terminal, allows placing of the first terminal 2 and the second terminal 3 with high accuracy.

Then, the sheet 8 arranged with the light emitting elements 1 each provided with the first terminal 2 and the second terminal 3 is heated in an oven or on a plate at about 280° C. or more for about one minute or more. Thus, the covering portion B made of Sn is melted and cured, and the light emitting element 1 and the electrically-conductive core A are bonded by eutectic bonding, so that the first terminal 2 and the second terminal 3 are fixed to the light emitting element 1.

Forming Light Reflecting Member

Subsequently, in a step of forming a light reflecting member, the light-reflecting member 4 is formed to hold the light emitting element 1, the first terminal 2, and the second terminal 3. In the present embodiment, as shown in FIG.

Figure 11A:
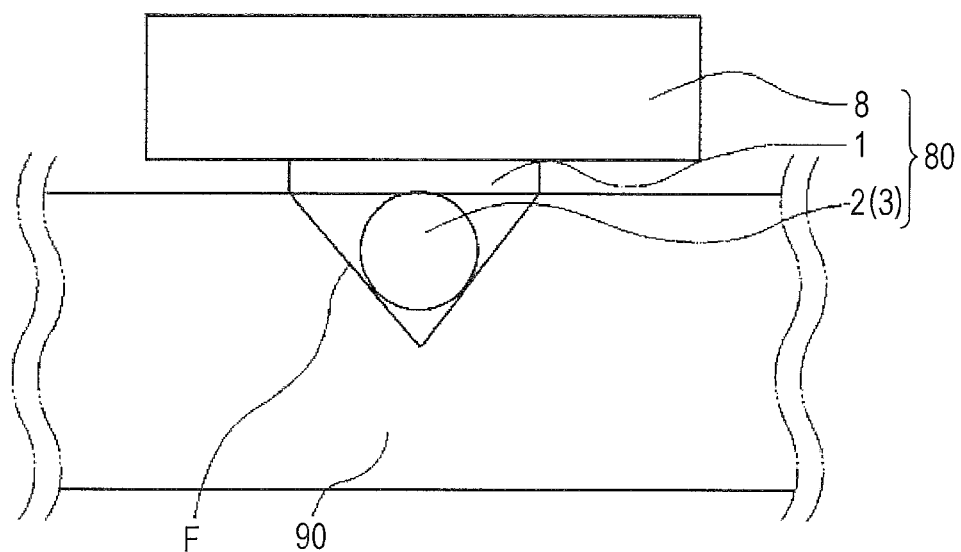
FIG. 11A is a schematic view showing a light reflecting member forming step in the method of manufacturing the light emitting device 10 according to the first embodiment.
Figure 11B:
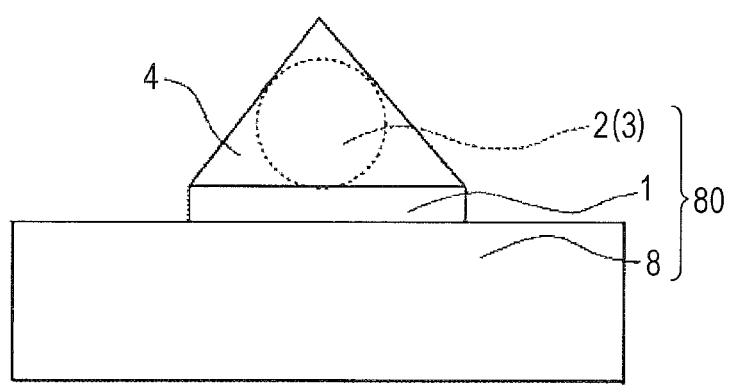
FIG. 11B is a schematic view showing the light reflecting member forming step in the method of manufacturing the light emitting device 10 according to the first embodiment.

11A, the sheet 8 arranged with the plurality of the light emitting elements 1 which are connected with the first terminals 2 and the second terminals 3 respectively (hereinafter, may be referred to as an "aggregate sheet 80") is set in a mold 90 provided with, for example, a substantially V-shaped groove F (a V-shaped groove in which two surfaces defining the groove meet at approximately a right angle) with the first terminals 2 and the second terminals 3 of the aggregate sheet 80 facing downward in the V-shaped groove of the mold 90, and a silicone resin which contains a light reflecting material such as titanium oxide is filled in the groove F and cured to form the light reflecting member 4. Thus, as shown in FIG. 11B, the light reflecting members 4 each having a substantially triangular prismatic shape can be formed to the aggregate sheet 80. The angle formed by the two surfaces that define the V-shaped groove F of the mold 90 can be appropriately set. The shape that defines the groove is not limited to the V shape, and an appropriate can be employed.

Exposing Terminal

In a step of exposing a terminal, the external terminal portions 2a and 3a are formed by partially exposing the terminals 2 and 3 from the light reflecting member 4 formed in the step of forming the light reflecting member. More specifically, as shown in FIG. 11C, a portion of the light reflecting members 4 and/or a portion of the terminals 2 and 3 are removed by blasting, cutting, grinding, or etching, so that the first terminal 2 and the second terminal 3 are partially exposed. For example, in the case where the first terminal 2 and the second terminal 3 are partially exposed by blasting, the blasting can be performed with a blast gun perpendicularly facing the surface to be removed. The first terminal 2 and the second terminal 3 have the substantially spherical shape, so that the external terminal portions 2a and 3a are each formed into a substantially circular shape. Accordingly, by simultaneously dicing the light reflecting member 4, the first terminal 2, and the second terminal 3, the external terminal portions 2a and 3a can be formed flush with the light reflecting member 4. According to the present embodiment, the external terminal portions 2a and 3a are formed in the bottom surface 4a of the light reflecting member 4 serving as the mounting surface of the light emitting device 10. The external terminal portions 2a and 3a are inclined with respect to the light emission surface of the light emitting device 10 similar to the bottom surface 4a of the light reflecting member 4. More specifically, each of the first terminal 2 and the second terminal 3 is partially exposed from the light reflecting member 4 in such a manner that the exposed portion forms an angle other than 90° with the light emission surface located opposite side from the surface (this surface is also referred to as a "connection surface") where the first terminal 2 and the second terminal 3 are connected. Thus, the light emission surface can be inclined with respect to the exposed surfaces of the first terminal 2 and the second terminal 3. Further, the external terminal portions 2a and 3a may not be formed in the mounting surface of the light emitting device 10 (the bottom surface 4a of the light reflecting member 4), and may be formed in another surface. Furthermore, the external terminal portions 2a and 3a may be formed after the light emitting device 10 are singulated.

In the case where each of the first terminal 2 and the second terminal 3 has the covering portion B, the covering portion B can be formed on the surface of each of the external terminal portions 2a and 3a after the external terminal portions 2a and 3a have been formed by the above method. For example, as shown in FIG. 11D, each of the external terminal portions 2a and 3a can be formed with the covering portion B in an outer edge of the substantially circular shape, and the light emitting device 10 can be bonded to the mounting substrate with the exposed covering portions B.

According to this embodiment, the wavelength conversion layer 5 may be formed to cover the light emission surface of the light emitting element 1. In this case, the wavelength of the light emitted from the light emitting element 1 can be converted to a predetermined desired wavelength. For example, the wavelength conversion layer 5 can be formed by using an appropriate predetermined method such that a silicone resin which contains a phosphor is sprayed, applied, or printed. The wavelength conversion layer 5 may be about 30 µm to about 300 µm in thickness.

Thus, as shown in FIG. 11D, the aggregate sheet 80 with the light reflecting member 4 (and the wavelength conversion layer 5) is singulated by dicing or the like, into respective light emitting devices 10. According to the present embodiment, the light reflecting member 4 in the singulated light emitting device 10 has the substantially triangular prismatic shape, so that it has the bottom surface 4a serving as the mounting surface of the light emitting device 10, the side surfaces 4b substantially perpendicularly abutting on the bottom surface 4a, and the front surface 4d inclined toward the back surface 4c with respect to the bottom surface 4a (mounting surface) and covering the electrode formation surface of the light emitting element 1. The light emitting device 10 may have dimensions of a width of about 2.0 mm, a height of about 0.1 mm to about 1.0 mm, and a depth of about 0.1 mm to about 1.0 mm. In addition, in a cross-sectional view, an angle formed by the mounting surface (the bottom surface 4a of the light reflecting member 4) and the light emission surface (the semiconductor layer 1a of the light emitting element 1) can be about 60°. In addition, the timing of removing the sheet 8 is not particularly limited, but the removing is preferably performed before singulating the aggregate sheet 80.

Method of Forming Light Emitting Module 100

The light emitting module 100 can be formed by mounting the light emitting device 10 formed as described above on the mounting substrate 20 that is previously provided. Hereinafter, a method of forming the light emitting module 100 will be illustrated. The method illustrated below is an example and an appropriate method and sequence of steps may be employed.

First, a bonding agent is applied onto the wiring 21 of the mounting substrate 20. For example, a solder serving as the bonding agent can be applied by screen printing using a metal mask. Subsequently, the light emitting device 10 is set on the bonding agent. In this state, a connecting agent 6 is melted and cured, so that the light emitting device 10 is electrically connected to the mounting substrate 20, and the light emitting module 100 shown in FIG. 8 is manufactured. In addition, as described above, in the case where each of the first terminal 2 and the second terminal 3 is formed such that the Cu core ball as the core A is covered with the Sn covering portion B, as shown in FIG. 11D, the covering portion B can be formed in the outer edge of each of the substantially circular external terminal portions 2a and 3a. With this arrangement, the light emitting device 10 can be bonded to the mounting substrate 20 by placing the external terminal portions 2a, 3a on the wiring 21 of the mounting substrate 20 and applying heat.

Second Embodiment

Light Emitting Device 30

Figure 12:
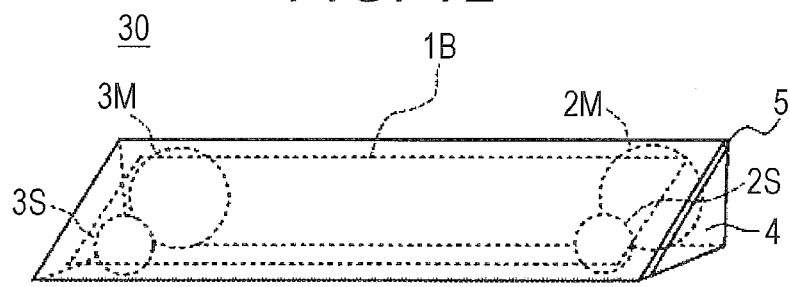
FIG. 12 is a schematic perspective view of a light emitting device 30 according to a second embodiment.

As shown in FIG. 12, the light emitting device 30 in the second embodiment may have substantially spherical first terminals 2S and 2M and second terminals 3S and 3M which are different in size. Hereinafter, a description will be given assuming that the smaller first terminal is 2S, the larger first terminal is 2M, the smaller second terminal is 3S, and the larger second terminal is 3M. Other than that, the light emitting device 30 can be configured similarly to the light emitting device 10 in the first embodiment, and the description thereof will be appropriately omitted.

Figure 13:
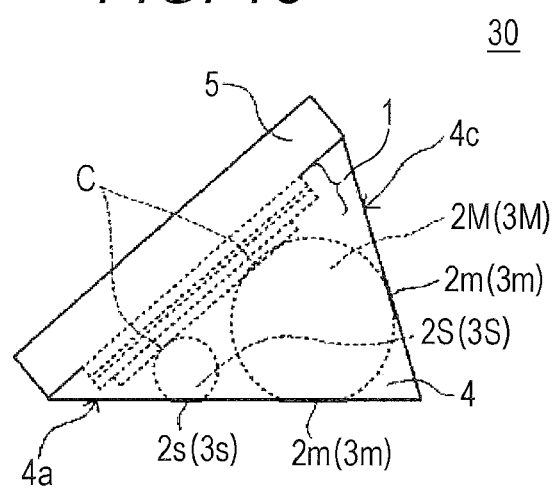
FIG. 13 is a schematic view of the light emitting device 30 according to the second embodiment, seen from a side surface side.

According to the present embodiment, as shown in FIG. 13, the first terminals 2S and 2M are arranged in a row in a depth direction and connected to one electrode of a light emitting element 1B, and the second terminals 3S and 3M are arranged in a row in the depth direction and connected to the other electrode of the light emitting element 1B (that is, a total of four terminals are connected to a single light emitting element 1B, in which two terminals are connected to each of the electrodes of the light emitting element 1B). The smaller first terminal 2S and the smaller second terminal 3S have substantially the same size (for example, a diameter of about 100 μm). In addition, the larger first terminal 2M and the larger second terminal 3M have substantially the same size (for example, a diameter of about 300 μm). The terminals of substantially the same size are respectively disposed in a row in a width direction in the light emitting element 1B. According to the present embodiment, the first terminal 2S and the second terminal 3S are disposed at a lower side of the light emitting element 1B, and the first terminal 2M and the second terminal 3M are disposed at an upper side of the light emitting element 1B. That is, as shown in FIG. 13, in a cross-sectional view, the first terminal 2M and the second terminal 3M are disposed closer to the back surface 4c of the light reflecting member 4 than the first terminal 2S and the second terminal 3S, respectively. That is, the first terminal 2M and the second terminal 3M are disposed in a portion having a larger distance between the electrode of the light emitting element 1B and a bottom surface 4a of the light reflecting member 4 than the first terminal 2S and the second terminal 3S, respectively).

According to the present embodiment, the external terminal portions 2s and 2m which are the partially exposed portions of the first terminals 2S and 2M, respectively, and the external terminal portions 3s and 3m which are the partially exposed portions of the second terminals 3S and 3M, respectively are formed in the bottom surface 4a of the light reflecting member 4. In addition, the external terminal portion 2m which is the partially exposed portion of the first terminal 2M, and the external terminal portion 3 which is the partially exposed portion of the second terminal 3M are respectively formed in the back surface 4c of the light reflecting member 4. These external terminal portions are electrically connected to the mounting substrate with the above-described bonding agent.

As described above, by connecting the substantially spherical first terminals 2 and second terminals 3 respectively have appropriately different sizes to the light emitting element 1B which is arranged to form an angle with the bottom surface 4a (mounting surface) of the light reflecting member, the light emitting device 30 whose light emission surface is inclined with respect to the mounting surface at a desired angle can be obtained. In a similar manner, the light emitting module can be formed in which the light emission surface of the light emitting device 30 faces obliquely upward with respect to the mounting surface. Furthermore, with a plurality of first terminals and second terminals, a plurality of external terminal portions can be formed, so that the connection strength between the light emitting device 30 and the mounting substrate can be improved.

In the present embodiment an example of two terminals (four terminals in total) respectively connected to each electrode of the light emitting element 1B is illustrated, but two or more first terminals or second terminals may be connected to the electrode. Further, the number and size of each of the first terminals and the second terminals can be appropriately changed so that the light emission surface of the light emitting device can be inclined at a desired angle with respect to the mounting substrate.

Modification of Second Embodiment

Figure 14:
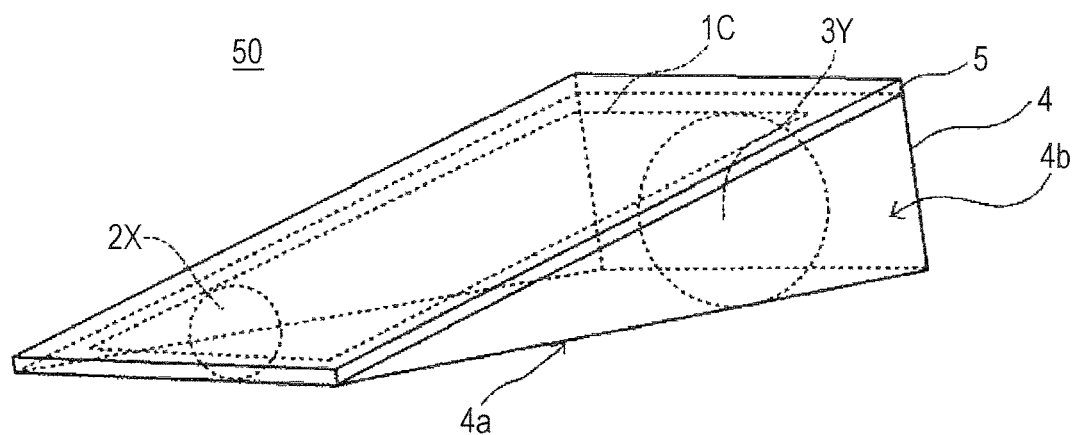
FIG. 14 is a perspective view of a light emitting device 50 according to a modification of the second embodiment.
Figure 15:
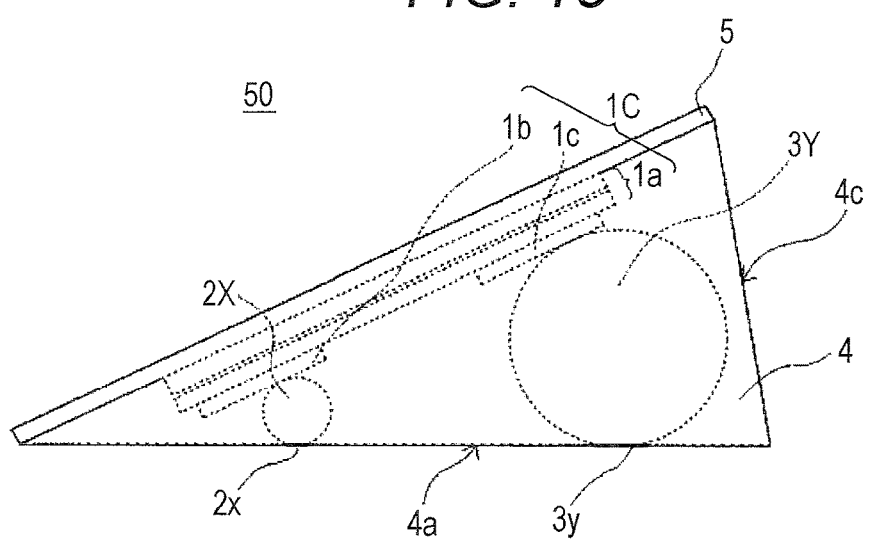
FIG. 15 is a schematic view of the light emitting device 50 according to the modification of the second embodiment, seen from a side surface side.

FIGS. 14 and 15 illustrate the modification of the second embodiment. A light emitting device 50 shown in FIGS. 14 and 15 includes one first terminal 2X and one second terminal 3Y which are substantially spherical in shape, different in size, and connected to a light emitting element 1C. According to the present embodiment, an n-side electrode 1b and a p-side electrode 1c of the light emitting element 1C are formed in a height direction. The first terminal 2X and the second terminal 3Y are disposed diagonally in the light emitting element 1C. The first terminal 2X is smaller than the second terminal 3Y (for example, a diameter of about 100 μm), and disposed on a lower side of the light emitting element 1C. The second terminal 3Y is larger than the first terminal 2X (for example, a diameter of about 300 μm), and disposed on an upper side of the light emitting element 1C. That is, in the cross-sectional view in FIG. 15, the second terminal 3Y is disposed closer to a back surface 4c of a light reflecting member 4 than the first terminal 2X (that is, disposed in a portion having a larger distance between the electrode of the light emitting element 1C and a bottom surface 4a of the light reflecting member 4).

According to the present embodiment, the external terminal portion 2x which is the partially exposed portion of the first terminal 2X, and the external terminal portion 3y which is the partially exposed portion of the second terminal 3Y are formed in the bottom surface 4a of the light reflecting member 4. These external terminal portions 2x and 3y are connected to the respective wirings of a mounting substrate with the above-described bonding agent.

As described above, with the use of the substantially spherical terminals, and appropriately changing their sizes and positions connected to the light emitting element 1C, not only in the case where the n-side electrode and the p-side electrode are arranged in the width direction but also in the case where the n-side electrode and the p-side electrode are arranged in different heights, the light emission surface can be inclined with respect to the mounting surface at the desired angle in the light emitting device. Similarly, the light emitting module can beformd with the light emission surface of the light emitting device facing obliquely upward with respect to the mounting substrate in the light emitting module.

Furthermore, by rotating the "light emitting element having the n-side electrode and the p-side electrode formed in the width direction" used in the first embodiment and the second embodiment by 90 degrees to change its direction, the light emitting element can be used as the "light emitting element 1C having the n-side electrode and the p-side electrode formed in the height direction" in the modification of the second embodiment. Therefore, according to the present embodiment, the light emitting devices having the light emission surfaces with different widths and heights can be obtained with the use of a same light emitting element.

According to the modification of the second embodiment, an example is illustrated with one terminal (two terminals in total) connected to each electrode of the light emitting element 1C, but one or more first terminals or second terminals may be connected to each electrode. Furthermore, the arrangement, the number, and the size of each of the first terminals and the second terminals can be appropriately changed.

The some embodiments have been described in the above, but the present invention is not limited to the above embodiments, and can be modified within the scope of the present invention as a matter of course.

A light emitting device according to an embodiment includes a light emitting element; a first terminal and a second terminal electrically connected to the light emitting element; and a light reflecting member for holding the light emitting element, the first terminal, and the second terminal, in which each of the first terminal and the second terminal has a substantially spherical shape; from the light reflecting member, a light emission surface of the light emitting element is exposed, and each of the first terminal and the second terminal is partially exposed into a substantially circular shape; and the light emission surface is inclined with respect to a mounting surface of the light emitting device.

As for a method of manufacturing a light emitting device according to an embodiment, the light emitting device includes a light emitting element, a first terminal and a second terminal electrically connected to the light emitting element, and a light reflecting member for holding the light emitting element, the first terminal, and the second terminal. The method includes: a step of connecting the first terminal and the second terminal each having a spherical shape, to the light emitting element; a step of forming a light reflecting member to cover the light emitting element, the first terminal, and the second terminal such that a light emission surface of the light emitting element is exposed; and a step of exposing the first terminal and the second terminal partially from the light reflecting member, in which in the step of forming the light reflecting member, the light reflecting member is formed such that a mounting surface of the light emitting device is inclined with respect to the light emission surface.

A method of manufacturing a light emitting device according to an embodiment includes: a step of connecting a first terminal and a second terminal each having a spherical shape, to a light emitting element; a step of forming a light reflecting member to cover at least one part of the light emitting element, and the first terminal and the second terminal with the light reflecting member; and a step of exposing each of the first terminal and the second terminal partially from the light reflecting member so as to expose portions which form an angle other than 90° with a light emission surface provided opposite to a surface connected to the first terminal and the second terminal.

According to the light emitting device and the method of manufacturing the light emitting device in the embodiment, it is possible to provide the light emitting device capable of being connected to the mounting substrate with a stable manner.

Obviously, numerous modifications and variations of the present invention are possible in light of the above teachings. It is therefore to be understood that within the scope of the appended claims, the invention may be practiced otherwise than as specifically described herein.

What is claimed is:
1. A light emitting device comprising:
a light emitting element including a light emission surface to emit a light;
a mounting surface via which the light emitting device is to be placed, the light emission surface of the light emitting element being inclined with respect to the mounting surface;
a first terminal and a second terminal which are electrically connected to the light emitting element and each of which has a substantially spherical shape; and
a light reflecting member to hold the light emitting element, the first terminal, and the second terminal, the light emission surface of the light emitting element being exposed from the light reflecting member, a first portion of the first terminal and a second portion of the second terminal being exposed from the light reflecting member so that each of the first portion and the second portion has a substantially circular shape,
wherein the light reflecting member is in contact with the light emitting element, the first terminal, and the second terminal,
wherein the light reflecting member is resin enclosing the light emitting element, the first terminal, and the second terminal, and
wherein the first portion of the first terminal, the second portion of the second terminal, and the light reflecting member are flush with each other.

2. The light emitting device according to claim 1, wherein each of the first terminal and the second terminal is exposed from the mounting surface.

3. The light emitting device according to claim 1, further comprising:
a back surface adjacent to the mounting surface,
wherein an angle between the mounting surface and the back surface is a right angle or an acute angle in a cross-sectional view.

4. The light emitting device according to claim 1, wherein the light reflecting member has a substantially triangular shape in a cross-sectional view.

5. The light emitting device according to claim, further comprising:
a wavelength conversion layer provided on the light emitting element.

6. The light emitting device according to claim 1, wherein the first portion of the first terminal, the second portion of the second terminal, and the light reflecting member are flush with each other on the mounting surface.

7. The light emitting device according to claim 1, wherein the first portion of the first terminal, the second portion of the second terminal, and the light reflecting member are flush with each other to form a continuous surface.

8. The light emitting device according to claim 7, wherein the continuous surface is the mounting surface.

9. A method of manufacturing a light emitting device, comprising:
connecting a first terminal and a second terminal to a light emitting element, each of the first terminal and the second terminal having a substantially spherical shape;
forming a light reflecting member to cover the light emitting element, the first terminal, and the second terminal such that a light emission surface of the light emitting element is exposed from the light reflecting member and such that a mounting surface of the light emitting device is inclined with respect to the light emission surface, the light emitting element being to emit a light from the light emission surface, the light emitting device being to be placed via the mounting surface; and exposing the first terminal and the second terminal partially from the light reflecting member,
wherein the light reflecting member is in contact with the light emitting element, the first terminal, and the second terminal,
wherein the light reflecting member is resin enclosing the light emitting element, the first terminal, and the second terminal, and
wherein a first portion of the first terminal, a second portion of the second terminal, and the light reflecting member are flush with each other.

10. The method according to claim 9,
wherein the exposing includes exposing the first terminal and the second terminal partially from the mounting surface.

11. The method according to claim 9,
wherein the forming of the light reflecting member includes providing the light reflecting member using a mold having a substantially V-shaped groove.

12. The method according to claim 9,
wherein the first portion of the first terminal, the second portion of the second terminal, and the light reflecting member are flush with each other on the mounting surface.

13. The method according to claim 9,
wherein the first portion of the first to final, the second portion of the second terminal, and the light reflecting member are flush with each other to form a continuous surface.

14. The method according to claim 13,
wherein the continuous surface is the mounting surface.

15. A method of manufacturing a light emitting device, comprising:
connecting a first terminal and a second terminal to a connection surface of a light emitting element, each of the first terminal and the second terminal having a substantially spherical shape;
forming a light reflecting member to cover at least one part of the light emitting element, and the first terminal and the second terminal with the light reflecting member; and
exposing a first portion of the first terminal and a second portion of the second terminal from the light reflecting member so that a plane including the first portion and the second portion provides an angle other than 90 with respect to a light emission surface of the light emitting element opposite to the connection surface of the light emitting element,
wherein the light reflecting member is in contact with the light emitting element, the first terminal, and the second terminal,
wherein the light reflecting member is resin enclosing the light emitting element, the first terminal, and the second terminal, and
wherein the first portion of the first terminal, the second portion of the second terminal, and the light reflecting member are flush with each other.

16. The method according to claim 15,
wherein the first portion of the first terminal, the second portion of the second terminal, and the light reflecting member are flush with each other on the mounting surface.

17. The method according to claim 15,
wherein the first portion of the first terminal, the second portion of the second terminal, and the light reflecting member are flush with each other to form a continuous surface.

18. The method according to claim 17,
wherein the continuous surface is the mounting surface.

* * * * *